United States Patent
Menkhoff

(10) Patent No.: US 7,266,353 B1
(45) Date of Patent: Sep. 4, 2007

(54) CONTROL LOOP FOR DIGITAL SIGNALS

(75) Inventor: Andreas Menkhoff, Munich (DE)

(73) Assignee: Micronas GmbH, Freiburg (DE)

( * ) Notice: Subject to any disclaimer, the term of this patent is extended or adjusted under 35 U.S.C. 154(b) by 790 days.

(21) Appl. No.: 10/089,654

(22) PCT Filed: Sep. 27, 2000

(86) PCT No.: PCT/EP00/09454

§ 371 (c)(1),
(2), (4) Date: Sep. 24, 2002

(87) PCT Pub. No.: WO01/24360

PCT Pub. Date: Apr. 5, 2001

(30) Foreign Application Priority Data

Sep. 30, 1999  (DE) .................................. 199 47 048

(51) Int. Cl.
*H04B 1/06* (2006.01)
*H04B 7/00* (2006.01)

(52) U.S. Cl. ................ 455/240.1; 455/245.1; 455/136

(58) Field of Classification Search ............ 455/127.2, 455/136, 138, 200.1, 232.1, 239.1, 240.18, 455/245.1, 247.1, 250.1, 234.18, 240.1; 375/345, 375/316

See application file for complete search history.

(56) References Cited

U.S. PATENT DOCUMENTS

| 4,764,967 | A | 8/1988 | Christopher | 381/98 |
|---|---|---|---|---|
| 5,101,310 | A * | 3/1992 | Brown | 360/68 |
| 5,706,217 | A * | 1/1998 | Genrich | 708/200 |
| 6,859,504 | B1 * | 2/2005 | Kowalski | 375/345 |
| 6,885,851 | B1 * | 4/2005 | Miura | 455/234.1 |
| 2004/0005001 | A1 * | 1/2004 | Jones et al. | 375/232 |
| 2005/0186928 | A1 * | 8/2005 | Miura | 455/234.1 |

FOREIGN PATENT DOCUMENTS

| JP | 2 285804 | 11/1990 |
|---|---|---|
| JP | 2285804 | 11/1990 |
| JP | 10312201 | 11/1998 |

OTHER PUBLICATIONS

"Patent Abstracts of Japan," vol. 17, No. 44; Jan. 17, 1993.

(Continued)

*Primary Examiner*—Sonny Trinh
(74) *Attorney, Agent, or Firm*—O'Shea, Getz & Kosakowski, P.C.

(57) ABSTRACT

The invention improves the control behavior of a control circuit for digital signals which is used in AGCs (automatic gain control), using a simple supplementary circuit. In a first example of an embodiment, the output signal of an integrator member is looped back to the input of said integrator member in the loop-back branch of the control circuit. In a second example, a counter is provided. Said counter monitors the overflow of the integrator member and weights the input signal accordingly.

7 Claims, 1 Drawing Sheet

OTHER PUBLICATIONS

"Halbleiter-Schaltungstechnik," Ulrich Tietze and Christoph Schenk; 1980, pp. 483-487.
"Patent Abstracts of Japan," vol. 10, No. 2; Jan. 28, 1986, pp. 424.
Tavaras, G. et al: "High Performance Algorithms for Digital Signal Processing AGC" Proceedings of the International Symposium on Circuits and Systems, IEEE, vol. CONF 23, May 1, 1990.

Anonymous: "Adaptive Digital Automatic Gain Control", IBM Technical Disclosure Bulletin, vol. 27, 10B, Mar. 1, 1985, pp. 6334-6335.

Tietze et al. "Semiconductor Circuit Engineering", Springer-Verlag 1980; English translation of pp. 484-487.

* cited by examiner

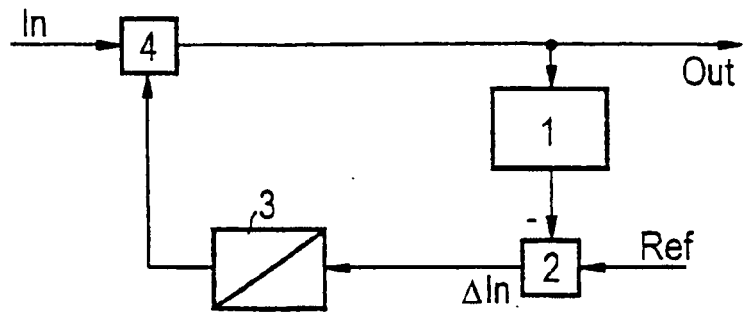
FIG 1 - PRIOR ART
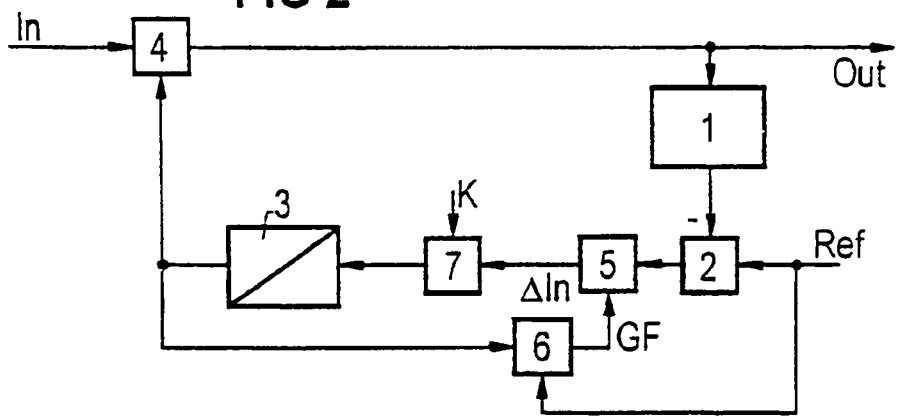
FIG 2
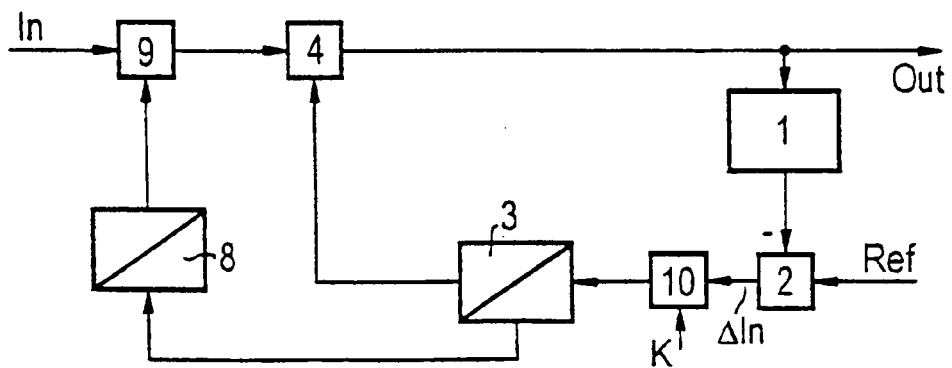
FIG 3

CONTROL LOOP FOR DIGITAL SIGNALS

BACKGROUND OF THE INVENTION

This invention relates to a control loop in which an input signal is converted, by multiplication by an integrator value, to an output signal that exhibits on average a constant reference value.

Such control loops are used, for example, as so-called AGC (automatic gain control) circuits for the automatic gain adaptation of digital signals. In automatic gain control, from an input signal, an output signal having a constant time-average value, whose level is as a rule adjustable and independent of the level of the input signal, is generated.

In detector circuits for high-frequency signals, the AGC is used to furnish, for further signal processing, an intermediate signal whose time-average level is constant, independently of the field strength of the detected signal of the input stage.

A known control loop for digital signals is illustrated in FIG. 1. The energy of an output signal OUT exhibits on average a constant value that can be set via a reference value REF. High-energy input signals thus must be diminished in amplitude and low-energy input signals must be augmented in amplitude.

The output signal OUT is first adapted in a signal converter 1 in such a fashion that it can be compared to the reference value REF. If the output signal OUT is, for example, an electric current, then a voltage proportional to the current is derived to the signal converter and then compared to a reference voltage. The signal converter 1 can also adapt the output signal OUT in such a fashion that the control behavior of the control loop is as favorable as possible. Signal-processing functions such as for example magnitude formation, squaring, or calculation of the distortion factor are suitable for this purpose. If one of the cited signal-processing functions is selected, it is guaranteed that only positive values are employed for the comparison even in case of a negative output signal OUT.

The comparison itself includes taking a difference with a difference element 2, in which the adapted output signal OUT is subtracted from the reference value REF. The difference element 2 supplies a difference $\Delta IN$. The difference $\Delta IN$ is fed to an integrator element 3, which determines an integrator value IW therefrom. The integrator element 3 cumulates the difference $\Delta IN$. If the difference $\Delta IN$ is positive, the integrator value IW is increased; if the difference $\Delta IN$ is negative, it is decreased. In a multiplication element 4, the input signal IN is multiplied by the integrator value IW. The result of this multiplication is the output signal OUT.

The circuit of FIG. 1 can be described mathematically by $$\Delta IN = REF - IN * IW$$

In the steady-state condition, that is, when the control loop has built up to a steady state, $\Delta IN = 0$. Hence it follows that $$\Delta IN = REF - IN * IW = 0$$

or, after manipulation, $$IW = REF/IN$$

Hence, finally, one obtains the desired output value OUT as $$OUT = IN * IW = IN * REF/IN = REF$$

The disadvantage of this circuit is the long buildup time that is required if the energy of the input signal IN deviates substantially from the reference value REF. In case of a large deviation, several hundred cycles are required to set the reference value REF exactly. This long buildup time is not acceptable in time-critical control tasks.

It is a goal of the present invention to identify a control loop for the conversion of an input signal, by multiplication by an integrator value, into an output signal that exhibits on average a constant reference value, which control loop exhibits improved control behavior as a consequence of a simple supplementary circuit.

SUMMARY OF THE INVENTION

The invention has the advantage that the control behavior of the known control loop can be improved substantially with only a minor supplementary circuit. The individual components of the known control loop can continue to be used.

It is especially advantageous that the multiplication units and the division element can be implemented with simple shift registers (barrel shifters) if the constant factor or the reference value can be represented as a power of 2.

These and other objects, features and advantages of the present invention will become more apparent in light of the following detailed description of preferred embodiments thereof, as illustrated in the accompanying drawings.

BRIEF DESCRIPTION OF THE DRAWINGS

FIG. 1 illustrates a known control loop;

FIG. 2 illustrates a control loop according to the invention having additional feedback; and FIG. 3 illustrates a control loop according to the invention with counter.

DETAILED DESCRIPTION OF THE INVENTION

According to a first exemplary embodiment according to FIG. 2, a difference element 2 has its output connected to a first multiplication element 5. The difference element 2 exhibits inputs for a reference value REF and an output signal OUT. Before it is fed to the difference element 2, the output signal OUT can be adapted by a signal converter 1 to the reference value REF with respect to the physical unit. The difference element 2 forms the difference from the reference signal REF and the output signal OUT and passes this on to the first multiplication element 5. This multiplies the difference $\Delta IN$ by a weighting factor GF. The result is passed onto an integrator element 3. The integrator element 3 integrates the difference $\Delta IN$ weighted with the weighting factor GF. The result of this integration is forwarded by the integrator element 3 to a second multiplication element 4 as the integrator value IW. In second multiplication element 4, an input signal IN is multiplied by the integrator value IW. The result of this multiplication of the second multiplication element 4 represents the output signal OUT.

The weighting factor GF is derived from the integrator value IW and fed back via the first multiplication element 5 to the integrator element 3. Favorable control behavior results if the integrator value IW is not used directly as the weighting factor GF. It is more favorable to divide the integrator value IW by the reference value REF and weight the difference $\Delta IN$ therewith. The weighting factor GF in this case is the quotient of the integrator value IW and the reference value REF. A division element 6 is provided for the performance of this division IW/REF. A first input of the division element 6 is connected to an output of the integrator element 3 in order to feed the integrator value IW to the division element 6. A second input of the division element 6 is connected to an input of the difference element 2. The reference value REF is fed to the division element 6 via the second input. Additionally, a multiplication aaunit 7 can be provided between the first multiplication element 5 and the integrator element 3. The output signal OUT is subtracted from the reference value REF and weighted with the weighting factor GF, which is calculated from IW/REF. The weighted difference is multiplied by a constant factor K in the multiplication unit 7. The control behavior can be further improved through a suitable choice of the constant factor K. Here it is advantageous if the constant factor K exhibits a value in the buildup phase of the control loop that is different from the value in the steady state. For small values of K (e.g., K=0.1), the integrator element 3 needs more time for the difference $\Delta$IN to be integrated. A longer integration time is advantageous in case of an input signal IN having a high level of noise. In the ideal case in which the input signal exhibits no noise, K can be chosen equal to 1 in order to achieve rapid stabilization.

The division element 6 and the multiplication unit 7 can be implemented especially simply with shift registers. A prerequisite for doing so in the case of the division element is that the reference value REF can be represented as a power of 2 and, in the case of the multiplication unit, that the constant factor K, can be represented as a power of 2. The multiplication of a binary number by 2 corresponds to a shift of the binary number one place to the left. Analogously, division of a binary number by 2 corresponds to a shift of the binary number one place to the right.

According to a second exemplary embodiment according to FIG. 3, the difference element 2 again has its output connected to the integrator element 3. The difference element 2 subtracts from the reference value REF the output signal OUT, which may be adapted in the signal converter 1, and forwards the difference $\Delta$IN to the integrator element 3. In this exemplary embodiment, the integrator element 3 can take on only values between a lower and an upper threshold. If the integrator value already lies near the upper threshold, subsequent integration takes place near the lower threshold. If the integrator value IW lies near the lower threshold, then in case of a further decrease below the lower threshold, counting continues near the upper threshold. The integrator element 3 thus exhibits an overflow and an underflow. Along with the integrator value IW, there is at a carry output UA a count signal, which passes on any passage beyond one of the thresholds to a counter 8. The counter increments its count in case of overflow and decrements the count in case of underflow. The counter 8 has its output connected to an input multiplication element 9. The input multiplication element 9 multiplies the input signal IN by the count, which represents the number of passages beyond the lower and upper threshold. The result of this multiplication is fed to the second multiplication element 4, which multiplies it by the integrator value IW in order to obtain the output signal OUT.

With the exemplary embodiment according to FIG. 3, the input signal IN is scaled with a scaling factor. The scaling factor is $2^n$, where n corresponds to the count of counter 8. In case of large deviations of the input signal IN from the reference value REF, the scaling brings the input signal to the order of magnitude of the reference value. Thus it is guaranteed that the ratio of integrator value to reference value lies near 1.

A further improvement of the control behavior is achieved if an intermediate multiplication element 10 is provided between the integrator element 3 and the difference element 2. The difference $\Delta$IN is weighted with this by the factor K.

Although the present invention has been illustrated and described with respect to several preferred embodiments thereof, various changes, omissions and additions to the form and detail thereof, may be made therein, without departing from the spirit and scope of the invention.

What is claimed is:

1. A control loop for the conversion of an input signal, by multiplication by an integrator value, to an output signal that exhibits on average a constant reference value, comprising:
    a first multiplication element for multiplication of the input signal by the integrator value;
    a difference element for formation of a difference between the output signal and the reference value; and
    an integrator element for the formation of the integrator value from an integrator input signal,
    where a second multiplication element is provided between the difference element and the integrator element for the formation of the integrator input signal from the difference weighted with a weighting factor derived from the integrator value.

2. The control loop of claim 1, where a division element is provided for the calculation of the weighting factor by division of the integrator value by the reference value.

3. The control loop of claim 2, where a multiplication unit is connected between the integrator element and the second multiplication element for the multiplication of the integrating circuit input signal by a constant factor.

4. The control loop for the conversion of an input signal, by multiplication by an integrator value, to an output signal that exhibits on average a constant reference value, comprising:
    a multiplication element for the multiplication of the input signal by the integrator value;
    a difference element for the formation of a difference between the output signal and the reference value; and
    an integrator element for the formation of the integrator value from an integrator input signal,
    where a multiplication unit is provided for the scaling of the input signal with a value determined by a counter, which is connected to an output of the integrator element and counts the number of passages of the integrator value beyond a lower and an upper threshold, the multiplication unit and the multiplication element being connected in series.

5. The control loop of claim 4, where a further multiplication unit is connected between the integrator element and the difference element for the multiplication of the integrating circuit input signal by a constant factor.

6. The control loop of claim 5, where the multiplication unit is made as a shift register.

7. The control loop of claim 5, where the constant factor exhibits a value in the buildup phase of the control loop that is different from the value in the steady state.

* * * * *

UNITED STATES PATENT AND TRADEMARK OFFICE
CERTIFICATE OF CORRECTION

PATENT NO. : 7,266,353 B1
APPLICATION NO. : 10/089654
DATED : September 4, 2007
INVENTOR(S) : Andreas Menkhoff Page 1 of 1

It is certified that error appears in the above-identified patent and that said Letters Patent is hereby corrected as shown below:

Column 3 line 8, delete "aaunit" and insert --unit--

Signed and Sealed this

Twentieth Day of November, 2007

JON W. DUDAS
*Director of the United States Patent and Trademark Office*